United States Patent
Anegawa

(10) Patent No.: US 8,902,019 B2
(45) Date of Patent: Dec. 2, 2014

(54) ELECTRONIC CIRCUIT

(75) Inventor: Osamu Anegawa, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 249 days.

(21) Appl. No.: 13/298,413

(22) Filed: Nov. 17, 2011

(65) Prior Publication Data

US 2012/0139660 A1 Jun. 7, 2012

(30) Foreign Application Priority Data

Dec. 2, 2010 (JP) .................. 2010-269563

(51) Int. Cl.
| H01P 5/12 | (2006.01) |
| H03H 7/18 | (2006.01) |
| H03H 7/21 | (2006.01) |
| H01P 3/00 | (2006.01) |

(52) U.S. Cl.
CPC *H03H 7/185* (2013.01); *H03H 7/21* (2013.01)
USPC .......................................... 333/117; 333/128

(58) Field of Classification Search
USPC .......... 333/115, 116, 117, 118, 127, 238, 128
See application file for complete search history.

(56) References Cited

U.S. PATENT DOCUMENTS 5,757,248 A * 5/1998 Bardal ............................. 333/33

FOREIGN PATENT DOCUMENTS

| JP | 3214218 B2 | 10/2001 |
| JP | 3471197 B2 | 11/2003 |

OTHER PUBLICATIONS

T. Yamaji et al., "An I/Q Active Balanced Harmonic Mixer with IM2 Cancelers and a 45° Phase Shifter", ISSCC98 PM Digest of Technical Papers, Feb. 1998, p. 368-369, 466.
Japanese Office Action dated Jul. 29, 2014, issued in corresponding Japanese Patent Application No. 2010-269563 w/English translation (4 pages).

* cited by examiner

*Primary Examiner* — Dean O Takaoka
(74) *Attorney, Agent, or Firm* — Westerman, Hattori, Daniels & Adrian, LLP

(57) ABSTRACT

An electronic circuit includes: a first resistor having a first terminal and a second terminal; a first transmission line that is coupled to the first terminal of the first resistor, has a first terminal to which a first input signal is input, and has a second terminal outputting a first output signal having a phase difference with respect to the first input signal; and a second transmission line that is coupled to the second terminal of the first resistor, has a first terminal to which a second input signal having a phase difference with respect to the first input signal is input, and has a second terminal outputting a second output signal having a phase difference with respect to the second input signal and having, the phase difference being smaller than a phase difference between the first input signal and the second input signal with respect to the first output signal.

18 Claims, 16 Drawing Sheets

ELECTRONIC CIRCUIT

CROSS-REFERENCE TO RELATED APPLICATION

This application is based upon and claims the benefit of priority of the prior Japanese Patent Application No. 2010-269563, filed on Dec. 2, 2010, the entire contents of which are incorporated herein by reference.

BACKGROUND (i) Technical Field

The present invention relates to an electronic circuit.

(ii) Related Art

Conventionally, in a wireless communication device, a spurious image frequency is restrained with an electronic circuit such as an image rejection mixer. The image rejection mixer has a distributor generating two signals having a different phase difference from a base signal. T. Yamaji et al., ISSCC98/Feb. 7, 1998/Salon 7/2:30 PM DIGEST OF TECHNICAL PAPERS PP368-370 (1998) discloses an example of a distributor having a buffer amplifier.

SUMMARY

In a case where an electronic circuit having a distributor has a buffer amplifier, it is difficult to use the electronic circuit in a high frequency wave band such as a quasi-millimeter wave band or a millimeter wave at 10 GHz to 300 GHz. And a scale of the electronic circuit gets larger because of the buffer amplifier.

It is an object to provide an electronic circuit that can be used in a high frequency wave band and has a simple structure.

According to an aspect of the present invention, there is provided an electronic circuit including: a first resistor having a first terminal and a second terminal; a first transmission line that is coupled to the first terminal of the first resistor, has a first terminal to which a first input signal is input, and has a second terminal outputting a first output signal having a phase difference with respect to the first input signal; and a second transmission line that is coupled to the second terminal of the first resistor, has a first terminal to which a second input signal having a phase difference with respect to the first input signal is input, and has a second terminal outputting a second output signal having a phase difference with respect to the second input signal and having, the phase difference being smaller than a phase difference between the first input signal and the second input signal with respect to the first output signal.

DETAILED DESCRIPTION

When a mixing for frequency conversion is performed in a wireless communication device, a spurious image frequency other than a mixing wave is generated. For example, a signal of an upper side band (USB) and a signal of a lower side band (LSB) are generated on an upper side and a lower side of a frequency of carrier wave respectively. One of the signals becomes the spurious image frequency. As a method of restraining the image frequency, there are a method of restraining an image with a filter, a method of using an image rejection mixer such as an electronic circuit 100 described later, and so on.

Figure 1:
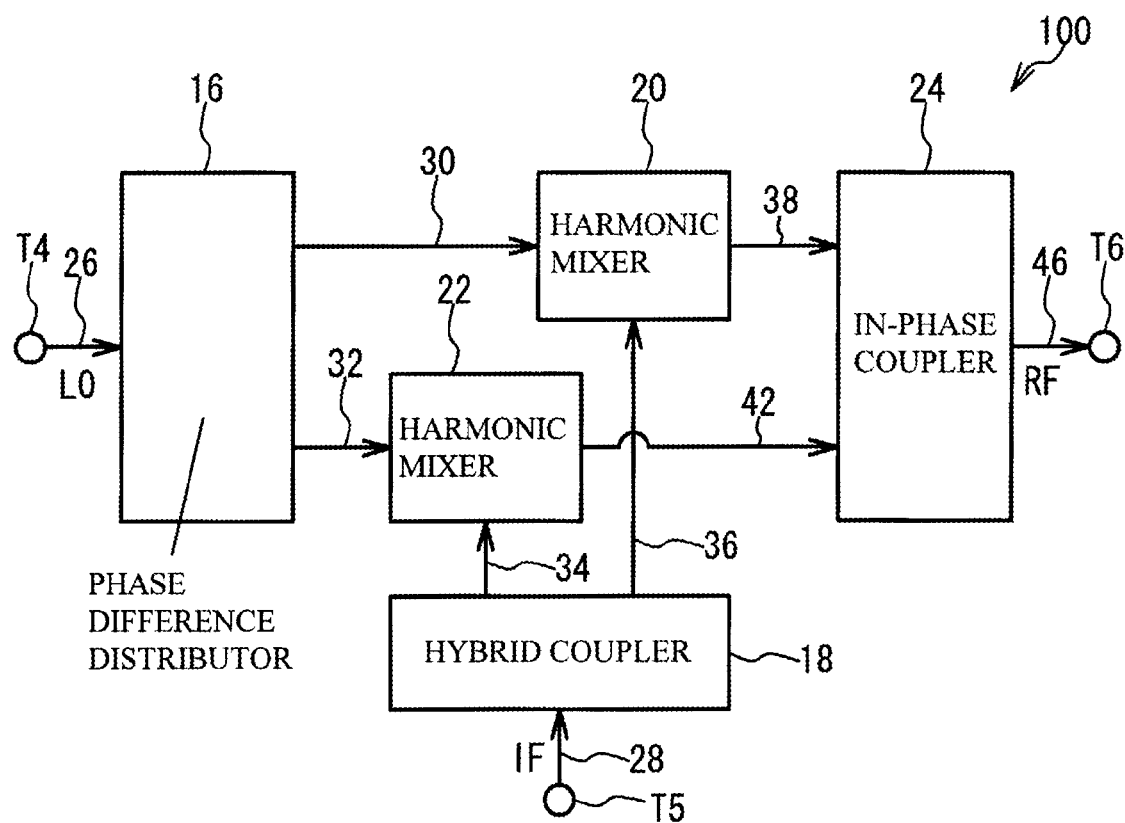
FIG. 1 illustrates a block diagram of an electronic circuit in accordance with a comparative embodiment.

A description will be given of a structure of an image rejection mixer. FIG. 1 illustrates a block diagram of the electronic circuit 100 in accordance with a comparative embodiment. The electronic circuit 100 is an example of an image rejection mixer. As illustrated in FIG. 1, the electronic circuit 100 has terminals T4, T5 and T6, a phase difference distributor 16, a hybrid coupler 18, harmonic mixers 20 and 22, and an in-phase coupler 24.

A local oscillator (hereinafter referred to as LO) signal 26 output from a local oscillation portion via the terminal T4 is input to the phase difference distributor 16. The phase difference distributor 16 generates signals 30 and 32 from the LO signal 26, a phase difference between the signals 30 and 32 being 45 degrees. In the comparative embodiment, the phases of the signals 30 and 32 are 0 degree and 45 degrees respectively. An Intermediate Frequency (hereinafter referred to as IF) signal 28 acting as an information signal is input to the hybrid coupler 18 via the terminal T5. The hybrid coupler 18 acts as a 90 degrees hybrid coupler distributing the IF signal 28 into signals 34 and 36 of which phase difference is 90 degrees. In the comparative embodiment, the phases of the signals 34 and 36 are 0 degree and 90 degrees respectively.

The harmonic mixer 20 mixes a doubled frequency of the signal 30 with the signal 36. With the mixing, a signal 38 including a signal 38a and a signal 38b is generated. The signal 38a is a sum of the doubled frequency of the signal 30 and the frequency of the signal 36. The signal 38b is a difference between the doubled frequency of the signal 30 and the frequency of the signal 36. The phase of the signal 38a is 90 degrees that is a sum of the doubled phase of the signal 30 (0 degree) and the phase of the signal 36 (90 degrees). The phase of the signal 38b is −90 degrees that is a difference between the doubled frequency of the signal 30 (0 degree) and the phase of the signal 36 (90 degrees).

The harmonic mixer 22 mixes a doubled frequency of the signal 32 with the signal 34. With the mixing, a signal 42 including a signal 42a and a signal 42b is generated. The signal 42a is a sum of the doubled frequency of the signal 32 and the frequency of the signal 34. The signal 42b is a difference between the doubled frequency of the signal 32 and the frequency of the signal 34. The phase of the signal 42a is 90 degrees that is a sum of the doubled phase of the signal 32 (45 degrees) and the phase of the signal 34 (0 degree). The phase of the signal 42b is 90 degrees that is a difference between the doubled frequency of the signal 32 (45 degrees) and the phase of the signal 34 (0 degree).

The in-phase coupler 24 combines the signal 38 and the signal 42. The phase of the signal 38a (90 degrees) is the same as that of the signal 42a. On the other hand, the phases of the signal 38b and the signal 42b are opposite from each other, because the phase of the signal 38b and the signal 42b are respectively −90 degrees and 90 degrees. The signal 42b and the signal 38b cancel each other. Therefore, the in-phase coupler 24 outputs a Radio Frequency (hereinafter referred to as RF) signal 46 to the terminal T6. The signal 46 is a signal in which the signal 38a is combined with the signal 42a.

When an image rejection mixer described above restrains an image, the phase difference distributor 16 may be structured with a buffer amplifier. However, when the phase difference distributor 16 is structured with a buffer amplifier, high accuracy distribution is difficult in a quasi-millimeter wave band or a millimeter wave band of 10 GHz to 300 GHz. A buffer amplifier is an active circuit. Therefore, the scale of the electronic circuit 100 gets larger.

A description will be given of embodiments for solving the above-mentioned problem with reference to figures.

[First Embodiment]

Figure 2:
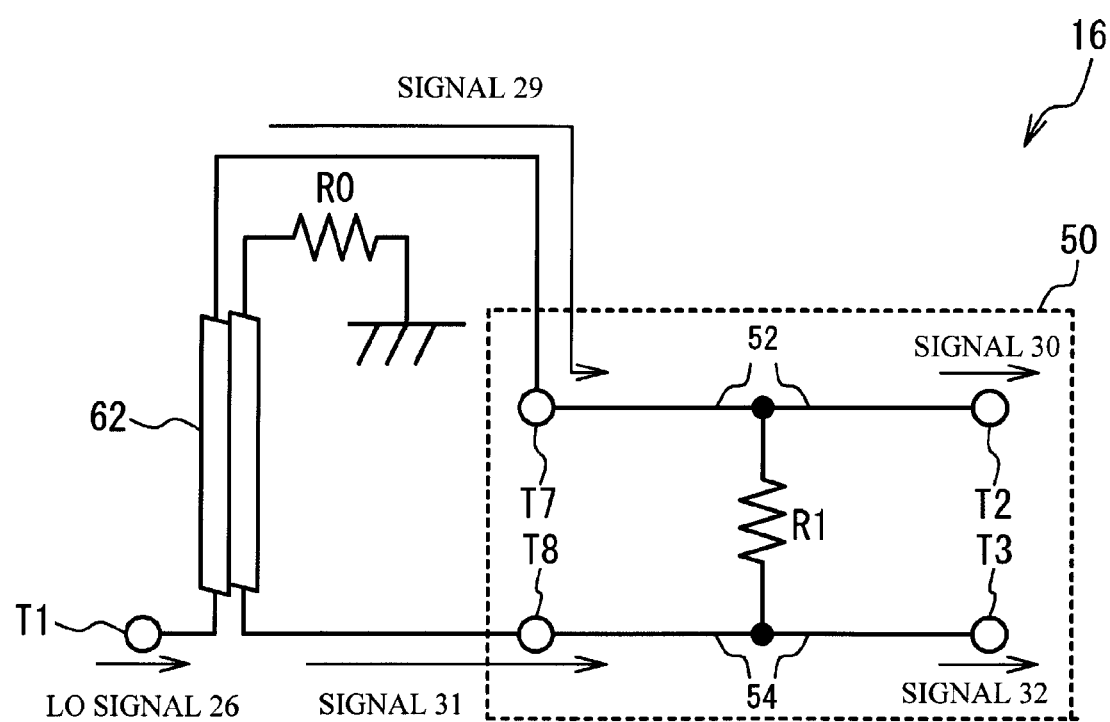
FIG. 2 illustrates a circuit diagram of an example of a phase difference distributor in accordance with a first embodiment.

FIG. 2 illustrates a circuit diagram of an example of the phase difference distributor 16 in accordance with the first embodiment. The same components as those illustrated in FIG. 2 have the same reference numerals as FIG. 1. As illustrated in FIG. 2, the phase difference distributor 16 has a terminal T1, a 90 degrees coupler 62 acting as a first coupler, a resistor R0, and a phase-shift circuit 50. The phase-shift circuit 50 has terminals T7, T8, T2 and T3 and a resistor R1. The 90 degrees coupler 62 is, for example, a 90 degrees hybrid coupler. The 90 degrees coupler 62 generates signals 29 and 31 of which phase difference is 90 degrees from the LO signal 26 input to the terminal T1, and outputs the signals 29 and 31 to the terminals T2 and T3 respectively. The resistor R0 between the 90 degrees coupler 62 and the ground is termination resistor of the 90 degrees coupler 62. The resistance value of the resistor R0 is, for example, 50Ω. In the following description, the phases of the signals 29 and 31 are 0 degree and 90 degrees respectively. In a transmission line 52 (hereinafter referred to as a first transmission line) coupling the terminal T7 and the terminal T2, the signal 29 is input to the terminal T7, and the signal 30 is output from the terminal T2. In a transmission line 54 (hereinafter referred to as a second transmission line) coupling the terminal T8 and the terminal T3, the signal 31 is input to the terminal T8, and the signal 32 is output from the terminal T3. A first terminal of the resistor R1 is coupled between the terminal T7 and the terminal T2, and a second terminal of the resistor R1 is coupled between the terminal T8 and the terminal T3. The first transmission line 52 and the second transmission line 54 are a micro strip line having characteristic impedance of 50Ω.

Figure 3:
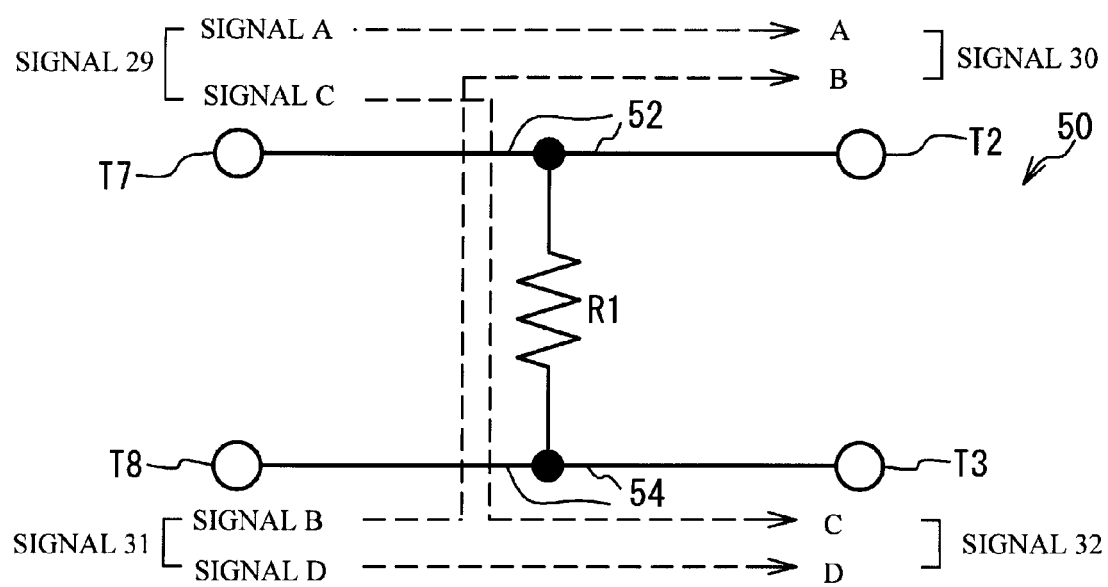
FIG. 3 illustrates a structure of a phase-shift circuit of the phase difference distributor and signal flow.

FIG. 3 illustrates a structure of the phase-shift circuit 50 of the phase difference distributor 16 and signal flow. The same components as those illustrated in FIG. 3 have the same reference numerals as FIG. 2. As illustrated in FIG. 3, the signal 29 is divided into a signal A and a signal C. The signal 31 is divided into a signal B and a signal D. The signal A is input to the terminal T7 and is output from the terminal T2 via the first transmission line 52. The signal C is input to the terminal T7 and is output from the terminal T3 via the first transmission line 52, the resistor R1 and the second transmission line 54. The signal B is input to the terminal T8 and is output from the terminal T2 via the second transmission line 54, the resistor R1 and the first transmission line 52. The signal D is input to the terminal T8 and is output from the terminal T3 via the second transmission line 54. The signal 30 in which the signal A and the signal B are combined is output from the terminal T2. The signal 32 in which the signal C and the signal D are combined is output from the terminal T3.

Figure 4A:
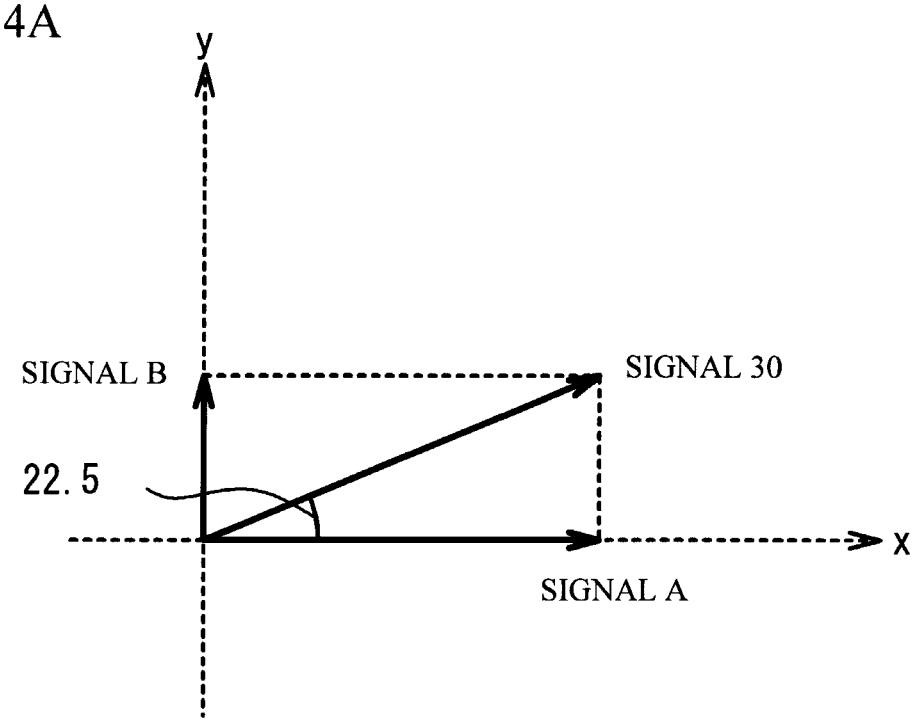
FIG. 4A and FIG. 4B illustrate a phase and amplitude of a signal of FIG. 3 in accordance with the first embodiment.
Figure 4B:
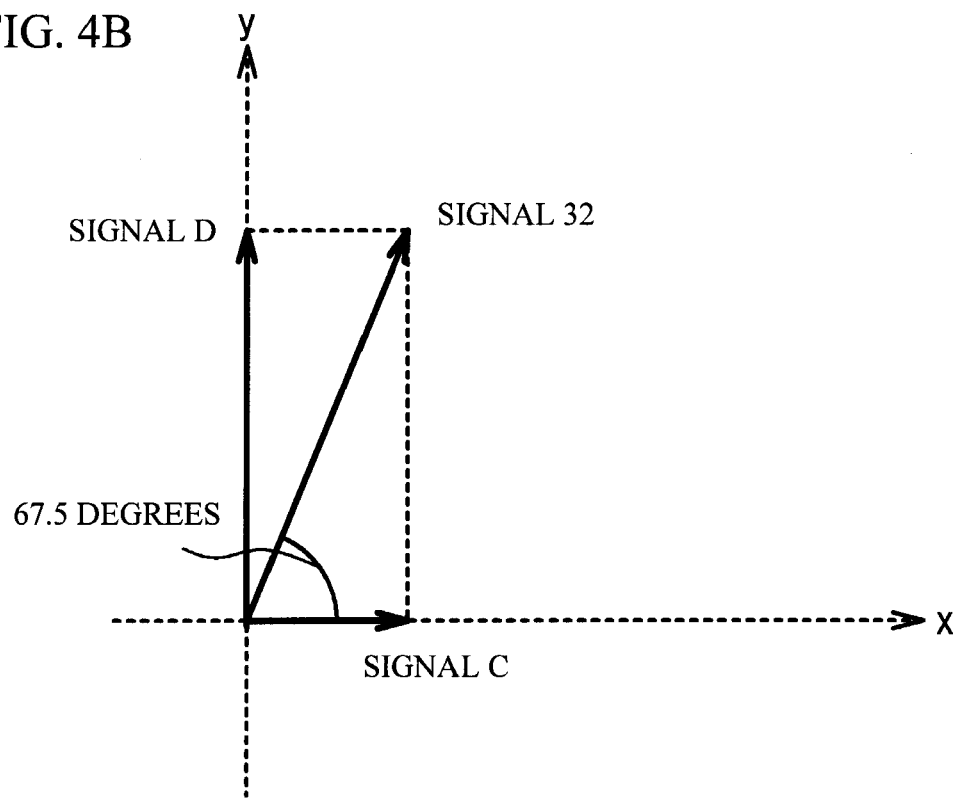

A description will be given of fluctuation of phase and amplitude of a signal with use of the phase-shift circuit 50 of the phase difference distributor 16 in accordance with the first embodiment, with reference to FIG. 4A and FIG. 4B. In the following description, phase and amplitude of electrical power of a signal is used as an example. FIG. 4A illustrates the phase and the amplitude of the signal A, the signal B and the signal 30. FIG. 4B illustrates the phase and the amplitude of the signal C, the signal D and the signal 32. In FIG. 4A and FIG. 4B, each signal is illustrated in a Cartesian coordinates having an x-axis acting as a horizontal axis and a y-axis acting as a vertical axis.

As illustrated in FIG. 4A, the phase of the signal A is 0 degree. The phase of the signal B is 90 degrees. The amplitude of the signal B is lower than that of the signal A because the resistor R1 uses the electrical power. Therefore, the phase of the signal 30 is lower than 45 degrees that is the phase of the signal 30 in a case where the amplitude of the signal A is the same as that of the signal B.

As illustrated in FIG. 4B, the phase of the signal C is 0 degree. The phase of the signal D is 90 degrees. The amplitude of the signal C is lower than that of the signal D because the resistor R1 uses the electrical power. Therefore, the phase of the signal 32 is larger than 45 degrees that is the phase of the signal 32 in a case where the amplitude of the signal C is the same as that of the signal D.

FIG. 4A and FIG. 4B illustrate a case where the resistance of the resistor R1 is set to be 33Ω so that the phases of the signals 30 and 32 are 22.5 degrees and 67.5 degrees respectively. When the characteristic impedance of the first transmission line 52 and the second transmission line 54 is "Z" and R1/Z is 33/50, as illustrated in FIG. 4A and FIG. 4B, the phase difference between the signal 30 and the signal 32 is 45 degrees (=67.5−22.5 degrees). In this way, when amplitude of signals input to the terminals T7 and T8 is equal to each other and the phase difference is 90 degrees that is larger than 45 degrees and smaller than 315 degrees, the phase difference between the signal 30 and the signal 32 can be 45 degrees with the resistor R1. The case where the phase difference is 45 degrees is a case of ideal operation condition. Therefore, in light of an actual operation condition, when the phase difference is larger than 42 degrees and smaller than 48 degrees, the electronic circuit 100 can operate without problem. The phase difference between the signal 30 and the signal 32 can be 15 degrees, by changing the value of the resistor R1. When the phase difference of the case is larger than 14 degrees and smaller than 16 degrees, the electronic circuit 100 can operate without problem.

In accordance with the first embodiment, as illustrated in FIG. 2, the electronic circuit 100 has the first transmission line 52 coupling the terminal T7 and the terminal T2, the second transmission line 54 coupling the terminal T8 and the terminal T3, and the resistor R1 acting as the first resistor. The resistor R1 has the first terminal and the second terminal. The first terminal of the resistor R1 is coupled to the first transmission line 52. The signal 29 acting as the first input signal is input from the terminal T7 acting as the first terminal of the first transmission line 52. The terminal T2 acting as the second terminal of the first transmission line 52 outputs the signal 30 acting as the first output signal having phase difference with respect to the signal 29. The second terminal of the resistor R1 is coupled to the second transmission line 54. The signal 31 acting as the second input signal having phase difference with respect to the signal 29 acting as the first input signal is input from the terminal T8 acting as the first terminal of the second transmission line 54. The terminal T3 acting as the second terminal of the second transmission line 54 outputs the signal 32 acting as the second output signal having phase difference with respect to the signal 30 acting as the first output signal that is smaller than the phase difference between the signal 29 and the signal 31. Thus, the phase difference between the signal 30 acting as the first output signal and the signal 32 acting as the second output signal can be set to be 45 degrees without using a structure such as a buffer amplifier. It is therefore possible to reduce the scale of the electronic circuit 100 and make the structure of the electronic circuit 100 simple compared to a case where the electronic circuit 100 has the buffer amplifier. And it is possible to use the electronic circuit 100 in a high frequency wave range of 10 GHz to 300 GHz.

In accordance with the first embodiment, the phase difference between the signal 29 acting as the first input signal and the signal 31 acting as the second input signal is 90 degrees. This is merely an example. The phase difference between the signal 29 and the signal 31 has only to be larger than 45 degrees and smaller than 315 degrees. However, in a case where the phase difference between the signal 29 and the signal 31 is 180 degrees, the phase difference between the signal 30 acting as the first output signal and the signal 32 acting as the second output signal is 0 degree. Therefore a case where the phase difference between the signal 29 and the signal 31 is 180 degrees is excluded.

In accordance with the first embodiment, the electronic circuit 100 has the 90 degrees coupler 62 acting as the first coupler generating the signal 29 acting as the first input signal and the signal 31 acting as the second input signal by converting the LO signal 26 acting as an input signal into two signals having a predetermined phase difference. The 90 degrees coupler 62 generates the first input signal and the second input signal from the LO signal 26 generated in a local oscillator. The 90 degrees coupler 62 may generate the first input signal and the second input signal from a signal generated by a device other than the local oscillator. The amplitude of signals input to the terminals T7 and T8 has only to be the same, and the phase difference between the signals has only to be larger than 45 degree and smaller than 315 degrees. However, it is preferable that the phase difference is larger than 70 degrees and smaller than 110 degrees, in light of an actual operation condition.

In accordance with the first embodiment, the first transmission line 52 and the second transmission line 54 are a micro strip line having characteristic impedance of 50Ω. However, they are an example. They may be a coplanar strip line, and the characteristic impedance may have another value.

Second Embodiment

Figure 5:
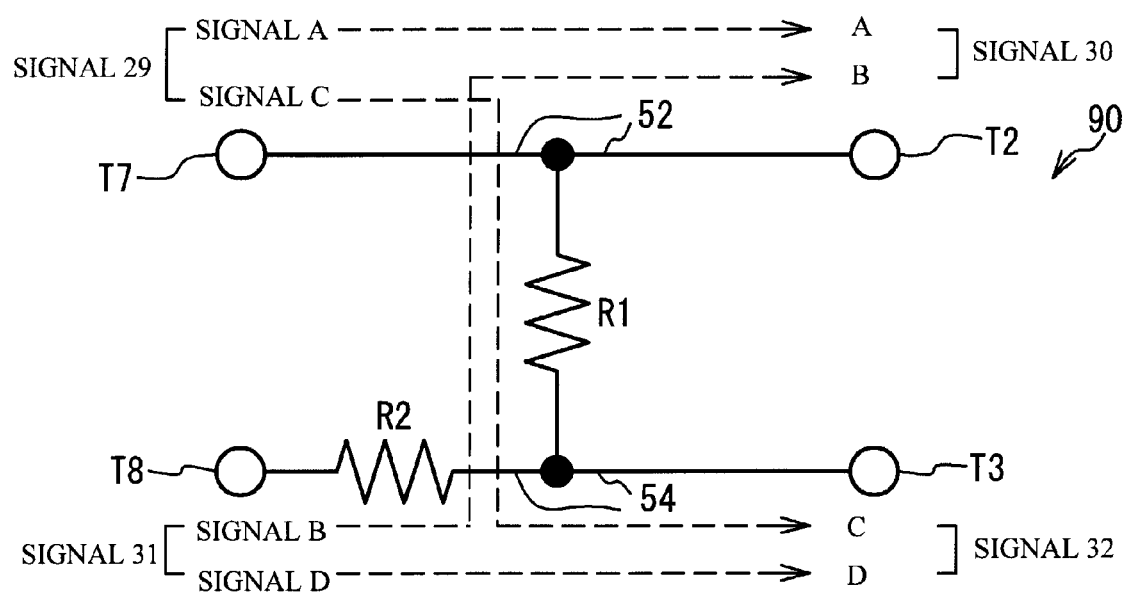
FIG. 5 illustrates a circuit diagram of a phase-shift circuit in accordance with a second embodiment.

A second embodiment is a modified embodiment of the phase-shift circuit 50 of the first embodiment. FIG. 5 illustrates a circuit diagram of a phase-shift circuit 90 in accordance with the second embodiment. The phase-shift circuit 90 illustrated in FIG. 5 is different from the phase-shift circuit 50 in a point that a resistor R2 is provided between the terminal T8 and the second terminal of the resistor R1.

In accordance with the seconds embodiment, the phase-shift circuit 90 has the resistor R2 acting as a second resistor coupled to between the terminal T8 acting as the first terminal of the second transmission line 54 and the second terminal of the resistor R1 acting as the first resistor in series. The resistor R2 makes a difference between the resistance value between the terminal T7 acting as the first terminal of the first transmission line 52 and the first terminal of the resistor R1 acting as the first resistor and the resistance value between the terminal T8 acting as the first terminal of the second transmission line 54 and the second terminal of the resistor R1 acting as the first resistance. With use of the resistor R2, the amplitude of the signal 31 can be adjusted. For example, when the amplitude of the signal 31 is larger than that of the signal 29, the resistor R2 can reduce the amplitude of the signal 31. Thus, the amplitude of the signal 31 can be adjusted to be the same as that of the signal 29. It is therefore possible to adjust the phase difference between the signal 30 and the signal 32 to be 45 degrees. In the embodiment, when the phase difference is larger than 42 degrees and smaller than 48 degrees, the phase-shift circuit 90 can operate without problem.

Third Embodiment

Figure 6:
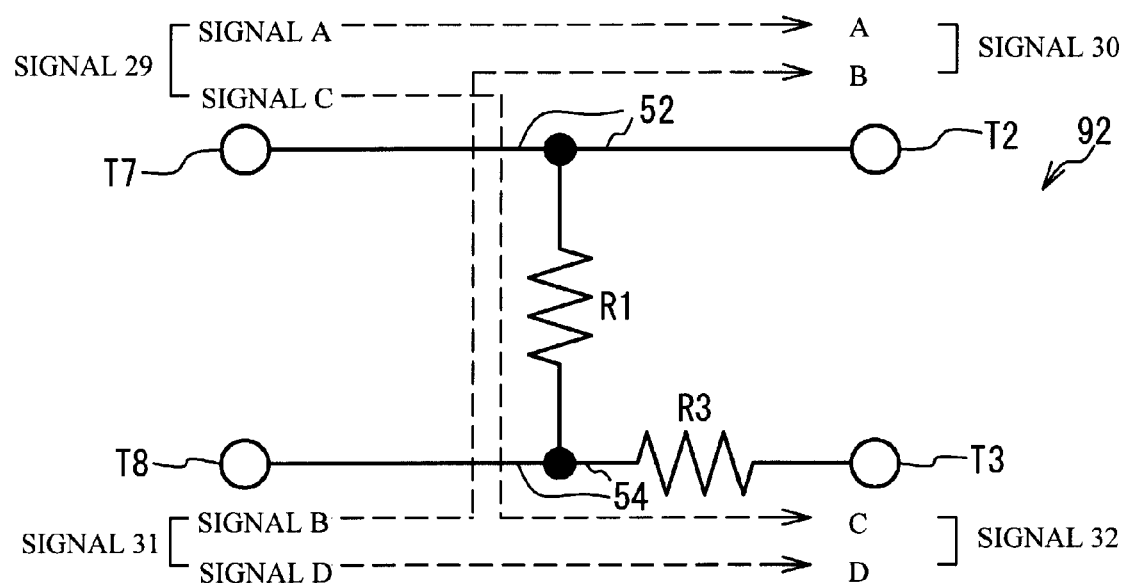
FIG. 6 illustrates a circuit diagram of a phase-shift circuit in accordance with a third embodiment.

A third embodiment is another modified embodiment of the phase-shift circuit 50 of the first embodiment. FIG. 6 illustrates a circuit diagram of a phase-shift circuit 92 in accordance with the third embodiment. The phase-shift circuit 92 illustrated in FIG. 6 is different from the phase-shift circuit 50 in a point that a resistor R3 is provided between the terminal T3 and the second terminal of the resistor R1.

In accordance with the third embodiment, the phase-shift circuit 92 has the resistor R3 acting as a third resistor coupled to between the second terminal of the resistor R1 acting as the first resistor and the terminal T3 acting as the second terminal of the second transmission line 54. The resistor R3 makes a difference between the resistance value between the first terminal of the resistor R1 acting as the first resistor and the terminal T2 acting as the second terminal of the first transmission line 52 and the resistance value between the second terminal of the resistor R1 acting as the first resistor and the terminal T3 acting as the second terminal of the second transmission line 54. With use of the resistor R3, the amplitude of the signal 32 can be adjusted. For example, when the amplitude of the signal 32 is larger than that of the signal 30, the resistor R3 can reduce the amplitude of the signal 32. Thus, the amplitude of the signal 30 can be adjusted to be the same as that of the signal 32. Therefore, the in-phase coupler 24 provided after the phase difference distributor 16 can cancel the reversed-phase signal 38b and signal 42b.

Fourth Embodiment

Figure 7:
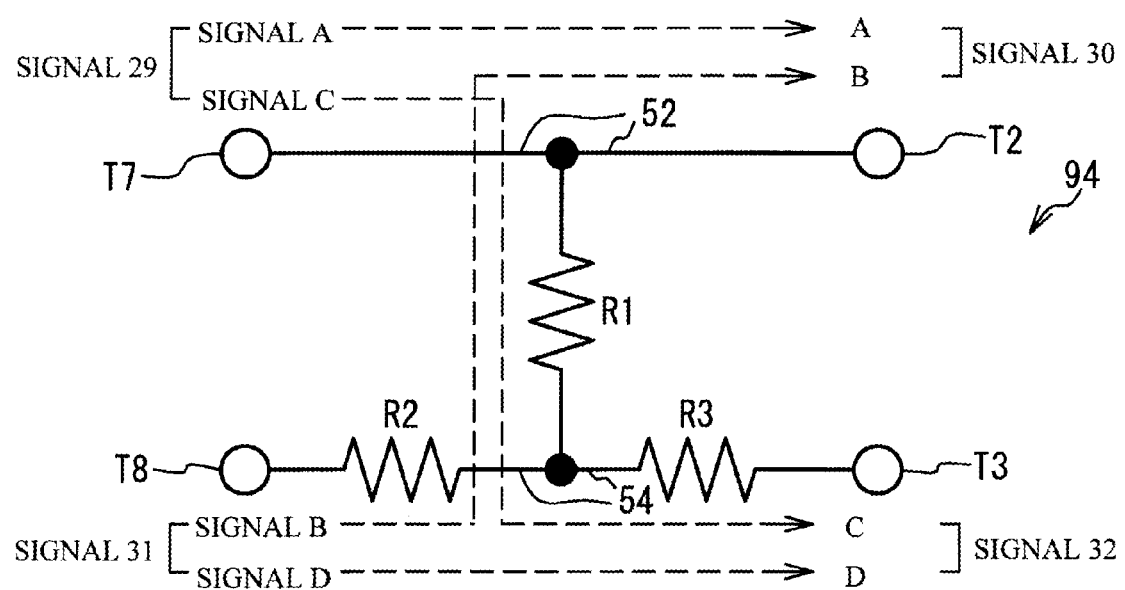
FIG. 7 illustrates a circuit diagram of a phase-shift circuit in accordance with a fourth embodiment.

A fourth embodiment is another modified embodiment of the phase-shift circuit 50 of the first embodiment. FIG. 7 illustrates a circuit diagram of a phase-shift circuit 94 in accordance with the fourth embodiment. The phase-shift circuit 94 illustrated in FIG. 7 is a combination of the second embodiment and the third embodiment and is different from the phase-shift circuit 50 in points that the resistor R2 is provided between the terminal T8 and the second terminal of the resistor R1 and the resistor R3 is provided between the terminal T3 and the second terminal of the resistor R1.

In accordance with the fourth embodiment, the phase-shift circuit 94 has the resistor R2 acting as the second resistor and the resistor R3 acting as the third resistor. The resistor R2 makes a difference between the resistance value between the terminal T7 acting as the first terminal of the first transmission line 52 and the first terminal of the resistor R1 acting as the first resistor and the resistance value between the terminal T8 acting as the first terminal of the second transmission line 54 and the second terminal of the resistor R1 acting as the first resistance. The resistor R3 makes a difference between the resistance value between the first terminal of the resistor R1 acting as the first resistor and the terminal T2 acting as the second terminal of the first transmission line 52 and the resistance value between the second terminal of the resistor R1 acting as the first resistor and the terminal T3 acting as the second terminal of the second transmission line 54. With use of the resistor R2 and the resistor R3, the amplitude of the signal 31 and the signal 32 can be adjusted. For example, the characteristic impedance of the first transmission line and the second transmission line are designed to be 50Ω in a high frequency wave circuit. However, when one of the resistors R2 and R3 having a large resistance value is provided on the second transmission line, impedance fluctuation causes a mismatch and loss tends to get larger. It is possible to reduce the impedance mismatch and restrain the loss by dividing the resistance into two parts of the resistors R2 and R3 and reducing each resistance value as illustrated in FIG. 7.

Fifth Embodiment

Figure 8:
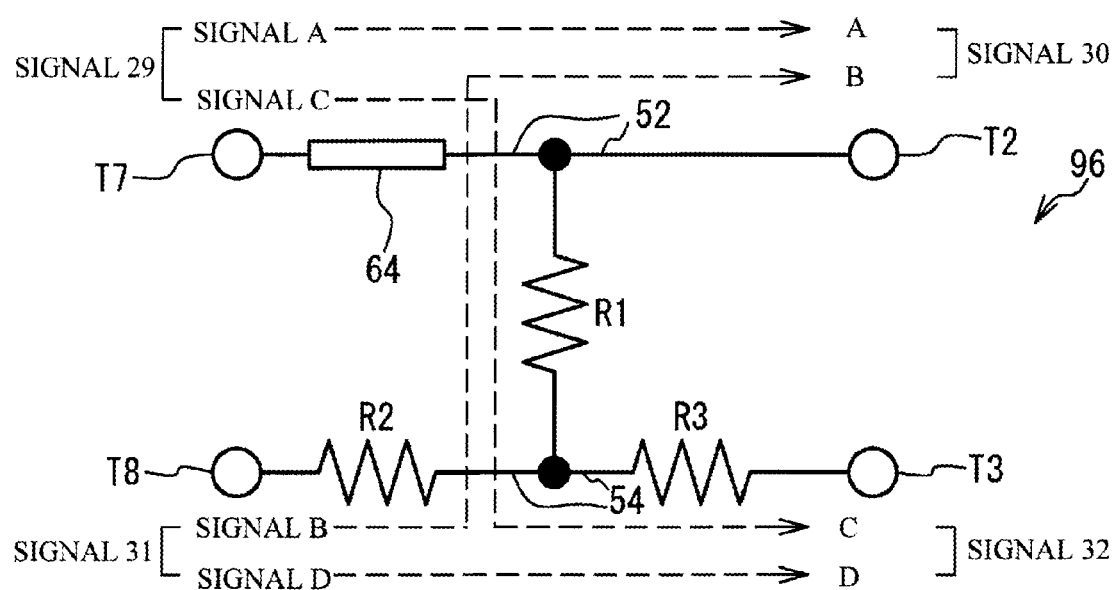
FIG. 8 illustrates a circuit diagram of a phase-shift circuit in accordance with a fifth embodiment.

A fifth embodiment is another modified embodiment of the phase-shift circuit 50 of the first embodiment. FIG. 8 illustrates a circuit diagram of a phase-shift circuit 96 in accordance with the fifth embodiment. The phase-shift circuit 96 illustrated in FIG. 8 is different from the phase-shift circuit 94 illustrated in FIG. 7 in a point that a distributed constant line 64 is provided between the terminal T7 and the first terminal of the resistor R1. The distributed constant line 64 is, for example, a micro strip line.

In accordance with the fifth embodiment, the phase-shift circuit 96 has the distributed constant line 64 between the terminal T7 and the first terminal of the resistor R1. The distributed constant line 64 makes a difference between the phase between the terminal T7 acting as the first terminal of the first transmission line 52 and the first terminal of the resistor R1 acting as the first resistor and the phase between the terminal T8 acting as the first terminal of the second transmission line 54 and the second terminal of the resistor R1 acting as the first resistance. The distributed constant line 64 can delay the signal 29. The distributed constant line 64 can correct the delay of the signal 31 caused by actual dimension of inserting of the resistor R2, by delaying the signal 29. For example, the distributed constant line 64 can delay the signal 29 so that the phase difference between the signals 29 and 31 caused by the resistors R2 and R1 gets closer to 90 degrees. When the phase difference between the signals 29 and 31 is larger than 90 degrees, the electrical power consumption of the resistor, R1 can be reduced more when the distributed constant line 64 delays the phase of the signal 29 so that the phase difference between the signals 29 and 31 gets closer to 90 degrees. In this case, it is possible to increase the electrical power efficiency.

In accordance with the fifth embodiment, as illustrated in FIG. 8, the phase-shift circuit 96 has the resistors R2 and R3 in addition to the resistor R1 and the distributed constant line 64. In a case where the delay amount of the signal 29 is adjusted without adjusting the amplitude of the signals 31 and 32, only the distributed constant line 64 may be provided in the phase-shift circuit 96 without providing the resistors R2 and R3. In accordance with the fifth embodiment, the phase-shift circuit 96 has the distributed constant line 64 coupled in series between the terminal T7 acting as the first terminal of the first transmission line 52 and the first terminal of the resistor R1. The phase-shift circuit 96 may have a distributed constant line coupled in series at least one of between the terminal T7 acting as the first terminal of the first transmission line 52 and the first terminal of the resistor R1 and between the first terminal of the resistor R1 and the terminal T2 acting as the second terminal of the first transmission line 52, may make difference between electrical lengths, and may adjust the delay amount of the signals 29 and 30.

Sixth Embodiment

Figure 9:
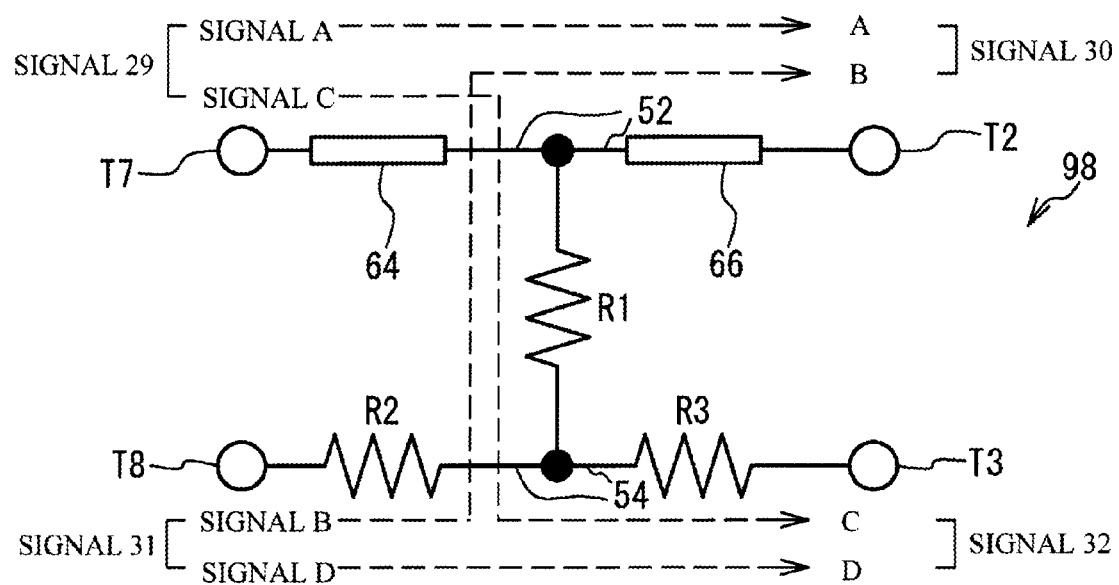
FIG. 9 illustrates a circuit diagram of a phase-shift circuit in accordance with a sixth embodiment.

A sixth embodiment is another modified embodiment of the phase-shift circuit 50 of the first embodiment. FIG. 9 illustrates a circuit diagram of a phase-shift circuit 98 in accordance with the sixth embodiment. The phase-shift circuit 98 illustrated in FIG. 9 has a structure in which a distributed constant line 66 is provided between the terminal T2 and the first terminal of the resistor R1 in addition to the structure of the phase-shift circuit 96 of FIG. 8. The distributed constant line 66 makes a difference between the phase between the first terminal of the resistor R1 acting as the first resistor and the terminal T2 acting as the second terminal of the first transmission line 52 and the phase between the second terminal of the resistor R1 acting as the first resistor and the terminal T3 acting as the second terminal of the second transmission line 54. It is possible to correct the phase difference between the signals 30 and 32 by changing the length of the distributed constant line 66.

Figure 10:
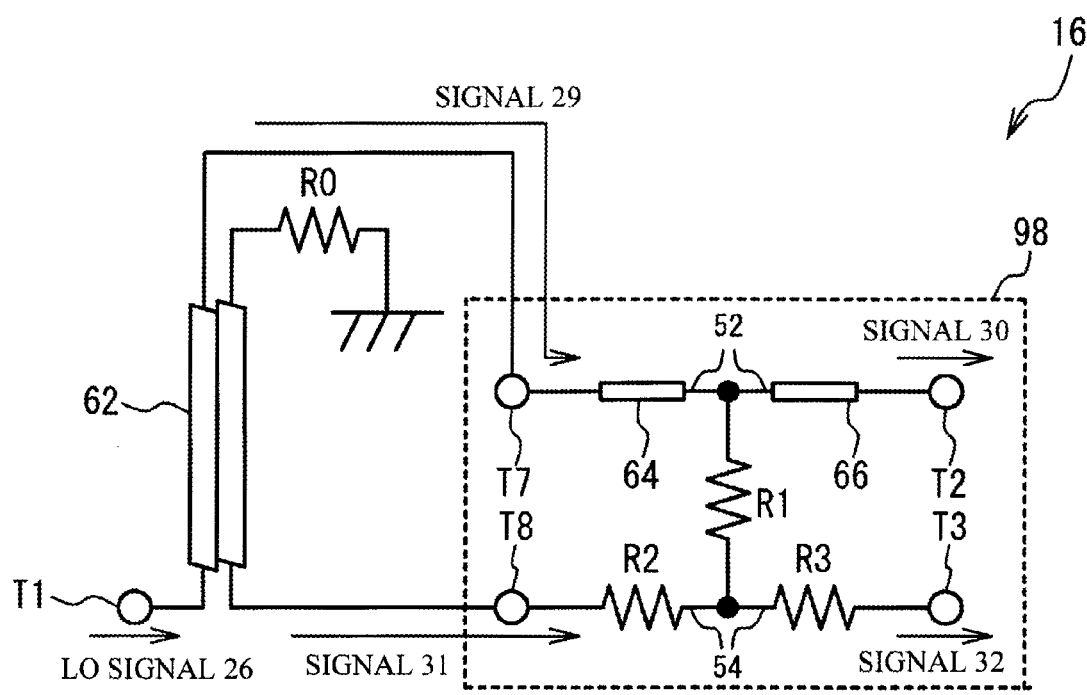
FIG. 10 illustrates a circuit diagram of the phase difference distributor in accordance with the sixth embodiment.

A description will be given of a concrete example where the phase difference distributor 16 having the phase-shift circuit 98 illustrated in FIG. 9 is used in 25 GHz band. FIG. 10 illustrates a circuit diagram of the phase difference distributor 16 in accordance with the sixth embodiment. The phase-shift circuit 98 of FIG. 10 is the same as FIG. 9. The resistance values of the resistors R0, R1, R2 and R3 are respectively 50Ω, 57Ω, 3Ω and 3Ω. The distributed constant lines 64 and 66 are a micro strip line having the characteristic impedance of 50Ω and have the length of 1.5 μm. The resistance values, the characteristic impedance of the distributed constant line, and the length are an example, thereby may be another value.

The phase difference between the signals 29 and 31 output from the 90 degrees coupler 62 is 100 degrees. The resistor R2 and the distributed constant line 64 adjust the phase difference between the signals 29 and 31 to be 90 degrees. The resistor R1 adjusts the phase difference between the signals 29 and 31 to be 60 degrees. The distributed constant line 66 adjusts the phase difference between the signals 30 and 32 to be 45 degrees. Thus, the frequency dependency of the phase difference is reduced when the phase difference is changed in stages. It is therefore possible to broaden the frequency band making the phase difference 45 degrees. In the embodiment, when the phase difference is larger than 42 degrees and smaller than 48 degrees, the phase-shift circuit 98 can operate without problem.

In contrast, in a case where the resistor R3 and the distributed constant line 66 are not provided in the phase-shift circuit 98; the phase difference between the signals 30 and 32 becomes 45 degrees when the characteristic impedance of the resistor R1 is set to be 36Ω. However, the phase difference changes drastically with respect to a frequency, if the phase difference is adjusted to be 45 degrees only with the resistor R1, the frequency dependency of the phase difference gets larger. It is therefore difficult to adjust the phase difference to be 45 degrees in a wide band.

Figure 11:
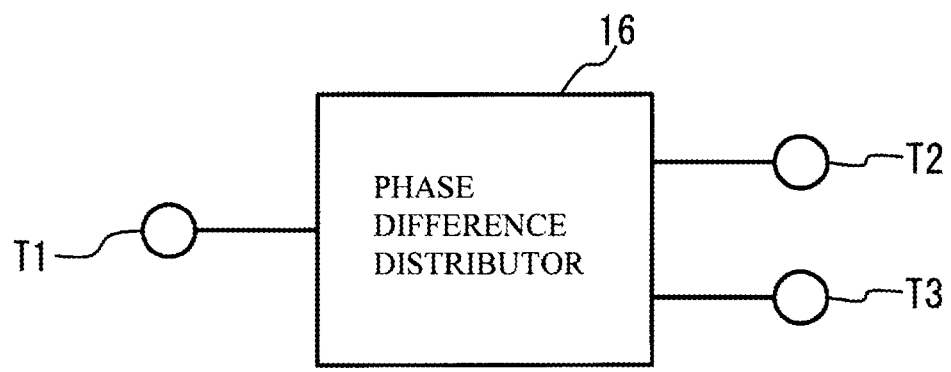
FIG. 11 illustrates a simplified structure of the phase difference distributor in accordance with the sixth embodiment.

A description will be given of a simulation result of a case where the phase difference distributor 16 of the sixth embodiment is applied to the electronic circuit 100 illustrated in FIG. 1, with reference to FIG. 11 through FIG. 16. FIG. 11 illustrates a simplified structure of the phase difference distributor 16 of the sixth embodiment. As illustrated in FIG. 11, the phase difference distributor 16 has the terminals T1, T2 and T3. A signal is input to the terminal T1, and a signal is output from the terminals T2 and T3.

Figure 12:
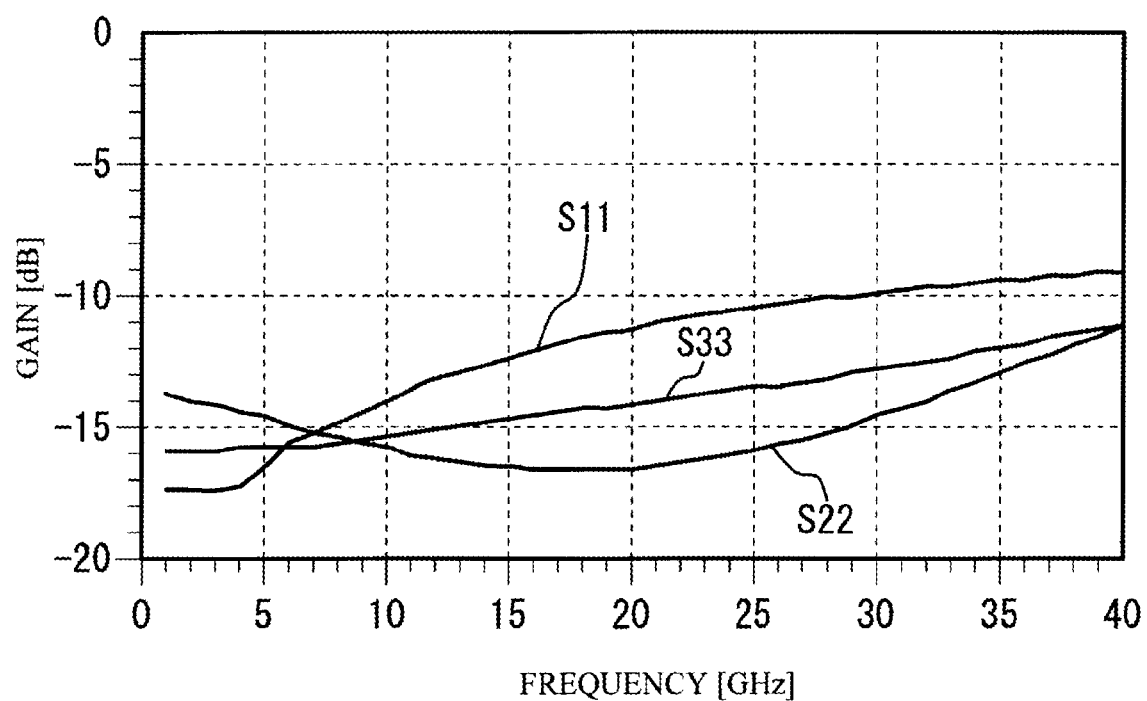
FIG. 12 illustrates a simulation result of a reflection gain of an input terminal and an output terminal of the phase difference distributor in accordance with the sixth embodiment.

FIG. 12 illustrates a simulation result of the reflection gain of the terminals T1, T2 and T3 of the phase difference distributor 16 of the sixth embodiment. A vertical axis of FIG. 12 indicates a gain [dB]. A horizontal axis indicates a frequency [GHz]. A solid line S11 indicates a graph of a reflection gain that is a gain of a signal output from the terminal T1 toward the signal input to the terminal T1. Similarly, solid lines S22 and S33 indicate a graph of a reflection gain at the terminals T2 and T3 respectively. As illustrated in FIG. 12, the phase difference distributor 16 can restrain the reflection gain of the terminals T2 and T3 in the frequency band of 25 GHz to 30 GHz.

Figure 13:
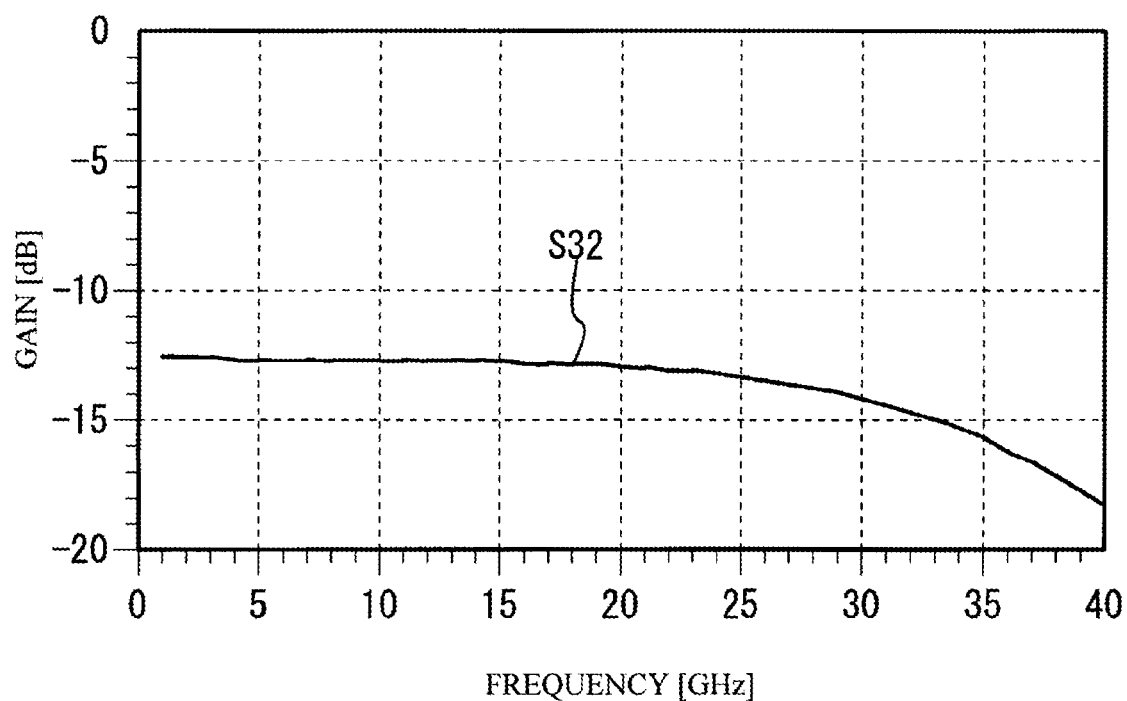
FIG. 13 illustrates a simulation result of isolation characteristics from one output terminal to the other output terminal of the phase difference distributor in accordance with the sixth embodiment.

FIG. 13 illustrates a graph (a solid line S32) of a simulation result of isolation characteristics from the terminal T2 acting as one of output terminals of the phase difference distributor 16 of the sixth embodiment to the terminal T3 acting as the other output terminal. A vertical axis of FIG. 13 indicates a gain [dB]. A horizontal axis of FIG. 13 indicates a frequency [GHz]. As illustrated in FIG. 13, the phase difference distributor 16 restrains the isolation characteristics in the frequency band of 25 GHz to 30 GHz. It is therefore possible to reduce the leakage of a signal.

Figure 14:
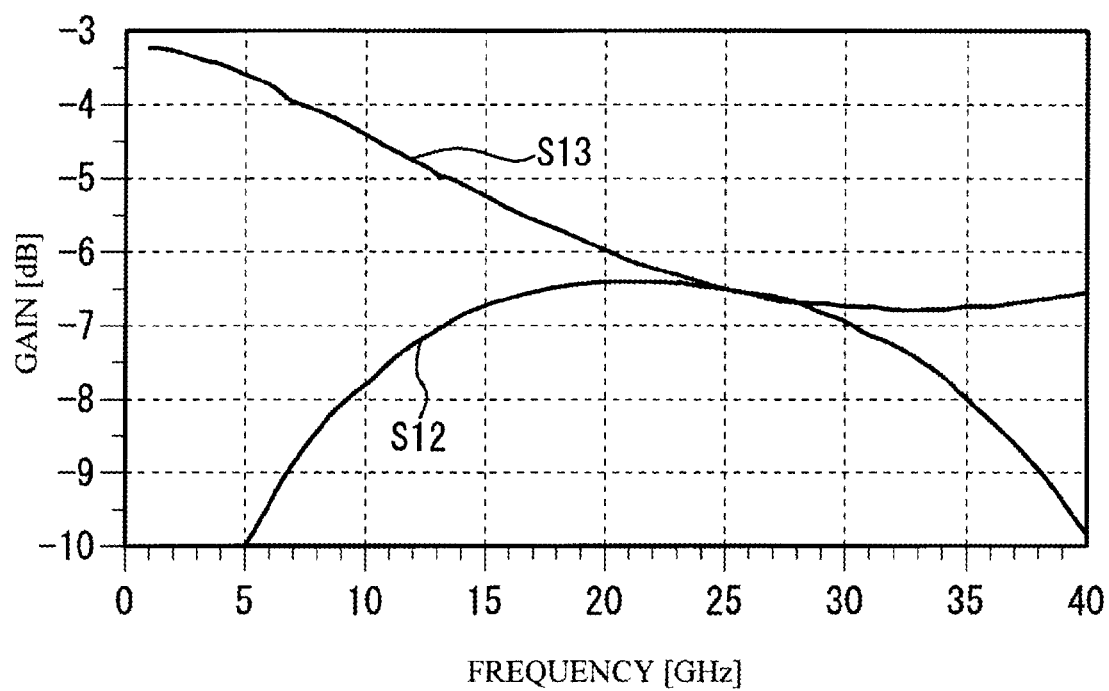
FIG. 14 illustrates a simulation result of a gain of an output terminal with respect to an input terminal of the phase difference distributor in accordance with the sixth embodiment.

FIG. 14 illustrates a graph of a simulation result of a gain of a signal output from the terminals T2 and T3 with respect to a signal input from the terminal T1 of the phase difference distributor 16 of the sixth embodiment. A vertical axis of FIG. 14 indicates a gain [dB]. A horizontal axis of FIG. 14 indicates a frequency [GHz]. The solid line S12 is a graph indicating a gain of a signal output from the terminal T2 with respect to a signal input from the terminal T1. The solid line S13 is a graph indicating a gain of a signal output from the terminal T3 with respect to a signal input from the terminal T1. As illustrated in FIG. 14, with use of the phase difference distributor 16, gains of signals output from the terminals T2 and T3 with respect to an input signal gets approximately equal to each other in the frequency band of 25 GHz to 30 GHz. It is therefore possible to obtain a favorable power balance.

Figure 15:
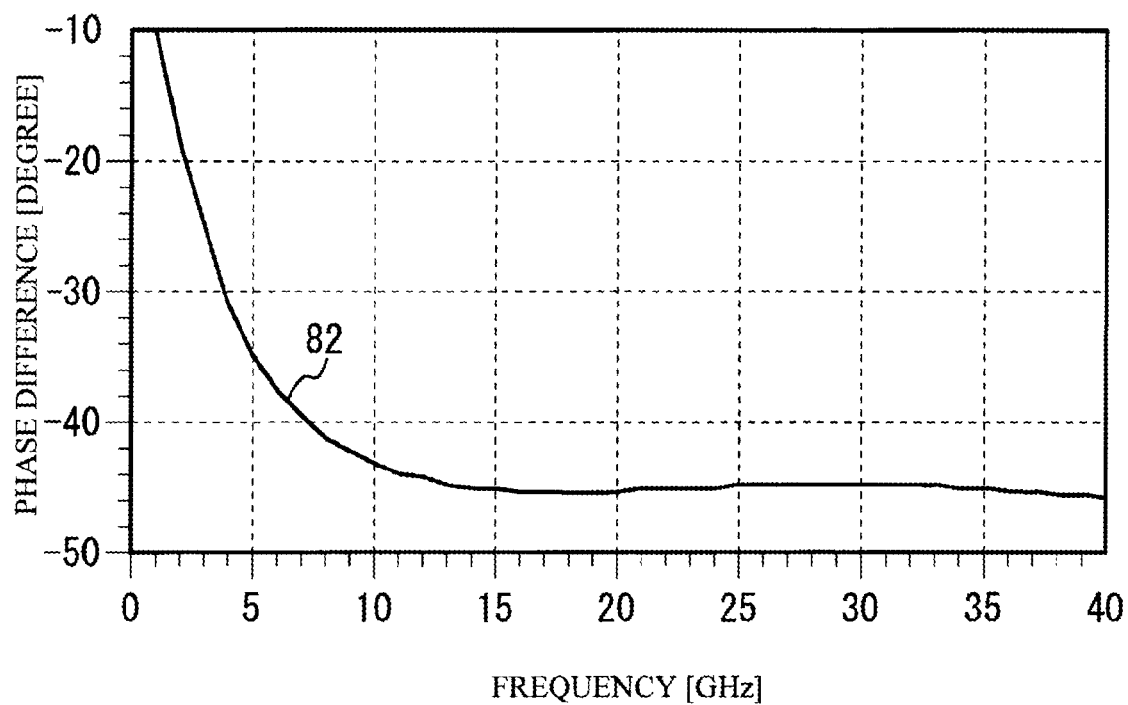
FIG. 15 illustrates a simulation result of a phase difference between signals output from an output terminal of the phase difference distributor in accordance with the sixth embodiment.

FIG. 15 illustrates a graph (a solid line 82) indicating a simulation result of the phase difference between the signals 30 and 32 output respectively from the terminal T2 and T3 acting as an output terminal of the phase difference distributor 16 of the sixth embodiment. A vertical axis of FIG. 15 indicates a phase difference [degree]. A horizontal axis of FIG. 15 indicates a frequency [GHz]. As illustrated in FIG. 15, with use of the phase difference distributor 16, the phase difference between the signals 30 and 32 gets approximately 45 degrees in the broad frequency band of 25 GHz to 30 GHz.

Figure 16:
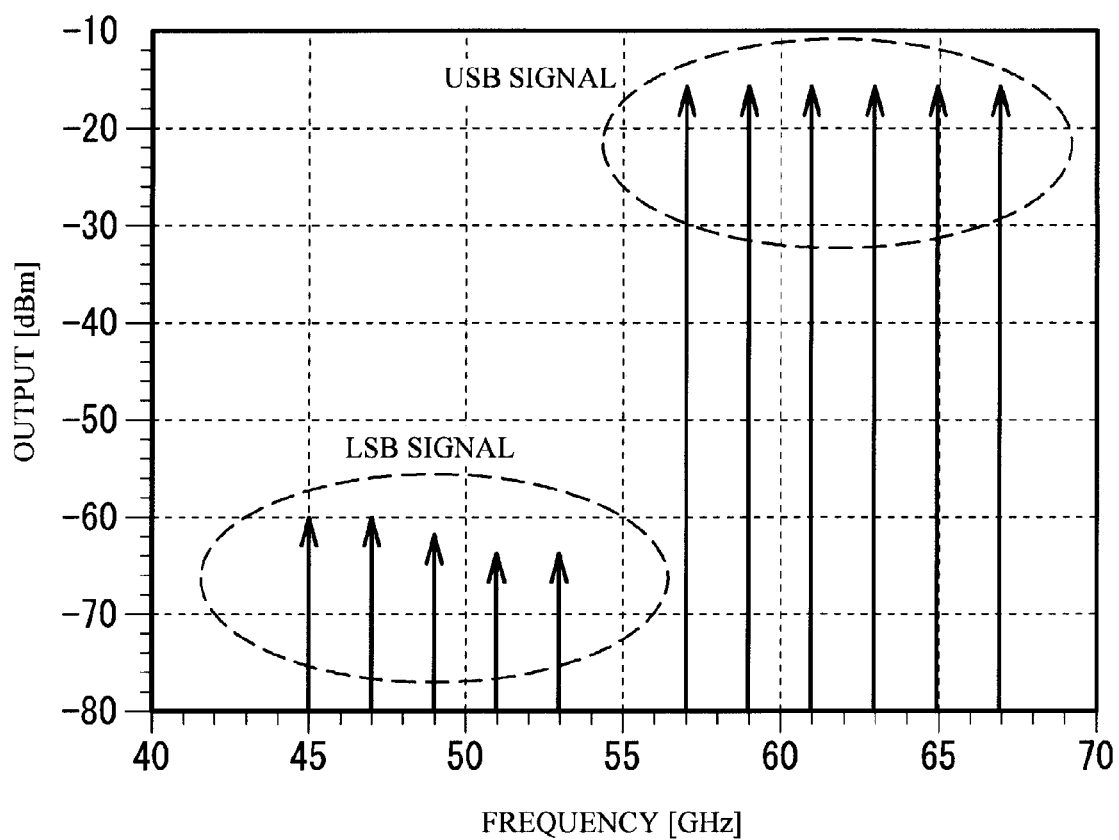
FIG. 16 illustrates a simulation result of an image rejection performed by an electronic circuit to which the phase difference distributor of the sixth embodiment is applied.

FIG. 16 illustrates a graph indicating a simulation result of an image rejection of the electronic circuit 100 to which the phase difference distributor 16 of the sixth embodiment is applied. FIG. 16 illustrates an example where the electronic circuit 100 restrains an LSB signal of a USB signal and the LSB signal. A vertical axis of FIG. 16 indicates an output [dBm] from the terminal T3. A horizontal axis of FIG. 16 indicates a frequency [GHz]. As illustrated in FIG. 16, the electronic circuit 100 can restrain the LSB signal by 40 dB or more, compared to the USB signal.

In accordance with the sixth embodiment, as illustrated in FIG. 9, the distributed constant line 66 is coupled to in series between the first terminal of the resistor R1 acting as the first resistor and the terminal T2 acting as the second terminal of the first transmission line 52. The resistor R1 adjusts the phase difference between the signal 30 acting as the first output signal and the signal 32 acting as the second output signal to be 60 degrees that is smaller than 90 degrees and larger than 45 degrees. The distributed constant line 66 adjusts the phase difference between the signals 30 and 32 to be 45 degrees from 60 degrees. Thus, the frequency dependency of the phase difference is reduced. It is therefore possible to broaden the frequency band allowing the phase difference of 45 degrees.

In accordance with the sixth embodiment, the distributed constant line 64 makes a difference between an electrical length between the terminal T7 acting as the first terminal of the first transmission line 52 and the first terminal of the resistor R1 acting as the first resistor and an electrical length between the terminal T8 acting as the first terminal of the second transmission line 54 and the second terminal of the resistor R1 acting as the first resistor. The distributed constant line 66 makes a difference between an electrical length between the first terminal of the resistor R1 acting as the first resistor and the terminal T2 acting as the second terminal of the first transmission line 52 and an electrical length between the second terminal of the resistor R1 acting as the first resistor and the terminal T3 acting as the second terminal of the second transmission line 54. At least one of electrical lengths between the terminal T7 acting as the first terminal of the first transmission line 52 and the first terminal of the resistor R1 acting as a first resistor and between the terminal T8 acting as the first terminal of the second transmission line 54 and the second terminal of the resistor R1 acting as the first resistor and electrical lengths between the first terminal of the resistor R1 acting as first resistor and the terminal T2 acting as the second terminal of the first transmission line 52 and between the second terminal of the resistor R1 acting as the first resistor and the terminal T3 acting as the second terminal of the second transmission line 54 has only to be different from each other.

In accordance with the sixth embodiment, the phase difference distributor 16 illustrated in FIG. 10 may be applied to the electronic circuit 100 illustrated in FIG. 1. As illustrated in FIG. 1, the electronic circuit 100 has the phase difference distributor 16, the hybrid coupler 18 acting as the second coupler, the harmonic mixer 20 acting as the first mixer, the harmonic mixer 22 acting as the second mixer, and the in-phase coupler 24 acting as the third coupler. The hybrid coupler 18 outputs the signal 34 acting as the third output signal and the signal 36 acting as the fourth output signal that have a reverse phase relation. The harmonic mixer 20 mixes the signal 38 acting as the fifth output signal that is a sum of a doubled, frequency of the first output signal and a frequency of the third output signal with a signal 40 acting as the sixth output signal that is a difference between a doubled frequency of the first output signal and the frequency of the third output signal, from the signal 30 acting as the first output signal and the signal 34 acting as the third output signal. The harmonic mixer 22 mixes the signal 42 acting as the seventh output signal that is a sum of a doubled frequency of the second output signal and a frequency of the fourth output signal with the signal 44 acting as the eighth output signal that is a difference between a doubled frequency of the second output signal and the frequency of the fourth output signal, from the signal 32 acting as the second output signal and the signal 36 acting as the fourth output signal. The in-phase coupler 24 combines the fifth output signal and the seventh output signal and combines the sixth output signal and the eighth output signal. The fifth output signal and the seventh output signal have an in-phase relation and thereby intensify each other. The sixth output signal and the eighth output signal have a reverse phase relation and thereby cancel each other. Thus, the in-phase coupler 24 outputs a signal in which the fifth output signal and the seventh output signal are combined. It is therefore possible to restrain an image as illustrated in FIG. 16.

The phase-shift circuit 98 of the sixth embodiment is an example. Therefore, the resistor and the distributed constant line are replaced with each other. For example, the resistor R2 and the distributed constant line 64 may be replaced with each other. The resistor R3 and the distributed constant line 66 may be replaced with each other.

The present invention is not limited to the specifically disclosed embodiments and variations but may include other embodiments and variations without departing from the scope of the present invention.

What is claimed is:

1. An electronic circuit comprising:
   a first resistor having a first terminal and a second terminal;
   a first transmission line that is coupled to the first terminal of the first resistor, has a first terminal to which a first input signal is input, and has a second terminal outputting a first output signal having a phase difference with respect to the first input signal; and
   a second transmission line that is coupled to the second terminal of the first resistor, has a first terminal to which a second input signal having a phase difference with respect to the first input signal is input, and has a second terminal outputting a second output signal having a phase difference with respect to the second input signal and having, the phase difference being smaller than a phase difference between the first input signal and the second input signal with respect to the first output signal.

2. The electronic circuit as claimed in claim 1, wherein the phase difference between the first output signal and the second output signal is larger than 42 degrees and smaller than 48 degrees.

3. The electronic circuit as claimed in claim 1, wherein the phase difference between the first output signal and the second output signal is larger than 14 degrees and smaller than 16 degrees.

4. The electronic circuit as claimed in claim 1, wherein the phase difference between the first input signal and the second input signal is larger than 70 degrees and smaller than 110 degrees.

5. The electronic circuit as claimed in claim 1, wherein a resistance value between the first terminal of the first transmission line and the first terminal of the first resistor and a resistance value between the first terminal of the second transmission line and the second terminal of the first resistor or the resistance value between the first terminal of the first resistor and the second terminal of the first transmission line and a resistance value between the second terminal of the first resistor and the second terminal of the second transmission line are different from each other.

6. The electronic circuit as claimed in claim 1, wherein at least one of electrical lengths between the first terminal of the first transmission line and the first terminal of the first resistor and between the first terminal of the second transmission line and the second terminal of the first resistor or electrical lengths between the first terminal of the first resistor and the second terminal of the first transmission line and between the second terminal of the first resistor and the second terminal of the second transmission line are different from each other.

7. The electronic circuit as claimed in claim 1, wherein the electronic circuit is used in a frequency band of 10 GHz to 300 GHz.

8. The electronic circuit as claimed in claim 1, wherein the first input signal and the second input signal have a same frequency.

9. The electronic circuit as claimed in claim 1 further comprising a first coupler generating the first input signal and the second input signal by converting an input signal into two signals having a given phase difference.

10. The electronic circuit as claimed in claim 9, wherein the input signal input to the first coupler is a signal generated by a local oscillator.

11. The electronic circuit as claimed in claim 1 further comprising:
    a second coupler distributing an information signal to a third output signal and a fourth output signal that have a different phase relation;
    a first mixer mixing the first output signal with the third output signal;
    a second mixer mixing the second output signal with the fourth output signal; and
    a third coupler combining an output of the first mixer with an output of the second mixer.

12. An electronic circuit comprising:
    a first transmission line having a first terminal that receives a first input signal and a second terminal that outputs a first output signal;
    a second transmission line having a first terminal that receives a second input signal having a phase different from the first input signal and a second terminal that outputs a second output signal; and
    a first resistor connected between the first transmission line and the second transmission line.

13. The electronic circuit as claimed in claim 12, wherein the first input signal and the second input signal have a same frequency.

14. The electronic circuit as claimed in claim 12, wherein a phase difference between the first output signal and the second output signal is narrower than a phase difference between the first input signal and the second input signal.

15. The electronic circuit as claimed in claim 12, further comprising a coupler that generates the first input signal and the second input signal from an input signal of the coupler.

16. The electronic circuit as claimed in claim 12, wherein the phase difference between the first output signal and the second output signal is larger than 42 degrees and smaller than 48 degrees.

17. The electronic circuit as claimed in claim 12, wherein the phase difference between the first output signal and the second output signal is larger than 14 degrees and smaller than 16 degrees.

18. The electronic circuit as claimed in claim 12, wherein the phase difference between the first input signal and the second input signal is larger than 70 degrees and smaller than 110 degrees.

* * * * *